SEMICONDUCTOR WAFER PICKUP AND BONDING TOOL

Original Filed Oct. 15, 1964 3 Sheets-Sheet 1

INVENTORS.
EARL A. ZANGER, JR.
PETER R. SZASZ
BY
Bilher & Mogeman [signature]
ATTORNEYS.

INVENTORS.
EARL A. ZANGER, JR.
PETER R. SZASZ
BY
Bilker & Moyerman
ATTORNEYS.

SEMICONDUCTOR WAFER PICKUP AND BONDING TOOL

Original Filed Oct. 15, 1964 3 Sheets-Sheet 3

INVENTORS.
EARL A. ZANGER, JR.
PETER R. SZASZ
BY
Zilher & Meyerman
ATTORNEYS.

United States Patent Office 3,458,102
Patented July 29, 1969

3,458,102
SEMICONDUCTOR WAFER PICKUP AND BONDING TOOL

Earl A. Zanger, Philadelphia, Pa., and Peter R. Szasz, Northlake, Ill., assignors to Kulicke and Soffa Industries, Inc., Fort Washington, Pa., a corporation of Pennsylvania Continuation of application Ser. No. 404,035, Oct. 15, 1964. This application Aug. 9, 1967, Ser. No. 659,539
Int. Cl. B23k 21/00
U.S. Cl. 228—3 11 Claims

ABSTRACT OF THE DISCLOSURE

A semiconductor wafer or die bonding tool adapted to be connected to a workholder of a semiconductor bonding apparatus of the type adapted to locate a semiconductor wafer opposite the bonding tool in an approximately oriented position. The apparatus is adapted to engage the bonding tool upon the wafer and in a camming action to orient and position the wafer in the tip of the tool by engagement of perimetrical edges of the upper surface of the wafer upon a recessed working face in the tip of the tool. The working surface in the tip of the tool is characterized by a plurality of individual facets cooperable with upper edge portions of the wafer to avoid contacting the wafer surfaces and to provide a firm edge hold upon the wafer during vibration incurred in bonding the wafer to a substrate.

This application is a continuation of Ser. No. 404,035, filed Oct. 15, 1964 and now abandoned.

This invention relates to a method and apparatus for picking up minature semiconductor dice and microcircuit wafers and transferring them to headers or substrates to which they are attached by a eutectic bond. More particularly, this invention relates to an improved tool for grasping individual wafers or dice from a tray and thereafter bonding them to a subassembly.

In the fabrication of semiconductor devices, individual dice or microcircuit wafers having surface electrodes or indicia thereon are first bonded to headers, substrates, or flat-back components prior to the connection of lead wires to the terminal posts of the devices and coupling of the individual surface electrodes with each other. At the present time, these surface electrodes or contacts may vary from 2 to as many as 20 in number, each having a typical dimension from a few tenths of a mil wide to from 2 to 12 mils in length. A typical header assembly of this type has a body diameter of perhaps a few tenths of an inch and a height of approximately the same dimension. The semiconductor or microcircuit die which is mounted on the body of the header may be approximately 25 mils square and a few thousandths of an inch in thickness. The thickness across any particular die may vary so as to produce a generally wedge-shaped configuration, and the edges of these dice may have a trapezoidal configuration which results from the crystalline construction of the semiconductor from which it is formed after the larger slab has been cracked along its scribed lines.

The usual means for assembling these dice upon their component assemblies has been to pick up an individual wafer die by its upper surface using a hypodermic-type needle or tubular member having a vacuum applied to its bore and transferring the dice to the header or substrate element. Such a system is fully described in prior U.S. Patent No. 3,083,291 entitled "Device for Mounting and Bonding Semiconductor Wafers." However, in engaging the upper die surface the needle was likely to damage the very delicate contacts disposed within the center portion thereof, especially in the case of multicontact microcircuits. Furthermore, this mode of handling could also result in substantial contamination of the contacts whereby it would become impossible to produce a satisfactory bond with lead wire subsequently attached. Moreover, because of the wedge-shaped thickness of the dice themselves, it was difficult for the needles of the prior systems to provide uniform contact pressure sufficient to form a consistent bond between the die and its header. In addition, because of the nature of the contact between the earlier hypodermic needle and the die, there was undue heat loss from the die during the bonding operation which greatly interfered with consistency in bonding. Hence, all of these deficiencies impeded high rates of production so desirable in highly competitive semiconductor device manufacture.

It is therefore an object of this invention to provide a wafer pickup and bonding tool in which damage to the top surface of the semiconductor dice, and especially to the surface contact electrodes, will be eliminated.

Another object of this invention is to provide a wafer pickup and bonding tool which will automatically accommodate for irregularities in thickness and configuration of the dice and transfer the dice to headers and substrates so as to produce consistently good bonds at high production rates.

Another object of this invention is to provide a wafer pick-up and bonding tool which will grasp each die by its marginal edges so as to minimize heat loss during wafer bonding operations.

Still another object of this invention is to provide a vibratory wafer pickup and bonding tool in which intimate interfacial bonding contact of the wafer with the header may be obtained by breaking interface oxides through scrubbing action.

A still further object of this invention is to provide a method for picking up, transferring and bonding semiconductor wafers upon headers and substrates at high production rates without likelihood of damage or contamination to the wafers or their surface contact electrodes.

Yet a further object of this invention is to provide a method for picking up and bonding semiconductor wafers to headers whereby each wafer becomes self-aligned and centered regardless of variations in thickness and peripheral configuration.

A further object of this invention is to provide a method for bonding semiconductor wafers in which eutectic formation is accelerated.

Other objects of this invention are to provide an improved device and method for bonding semiconductor wafers which is sturdy in construction, that is easily and economically produced and which is highly efficient and effective in operation.

With the above and related objects in view, this invention consists of the details of construction and combination of parts as will be more fully understood from the following detailed description when read in conjunction with the accompanying drawing, in which.

Figures 5, 9:
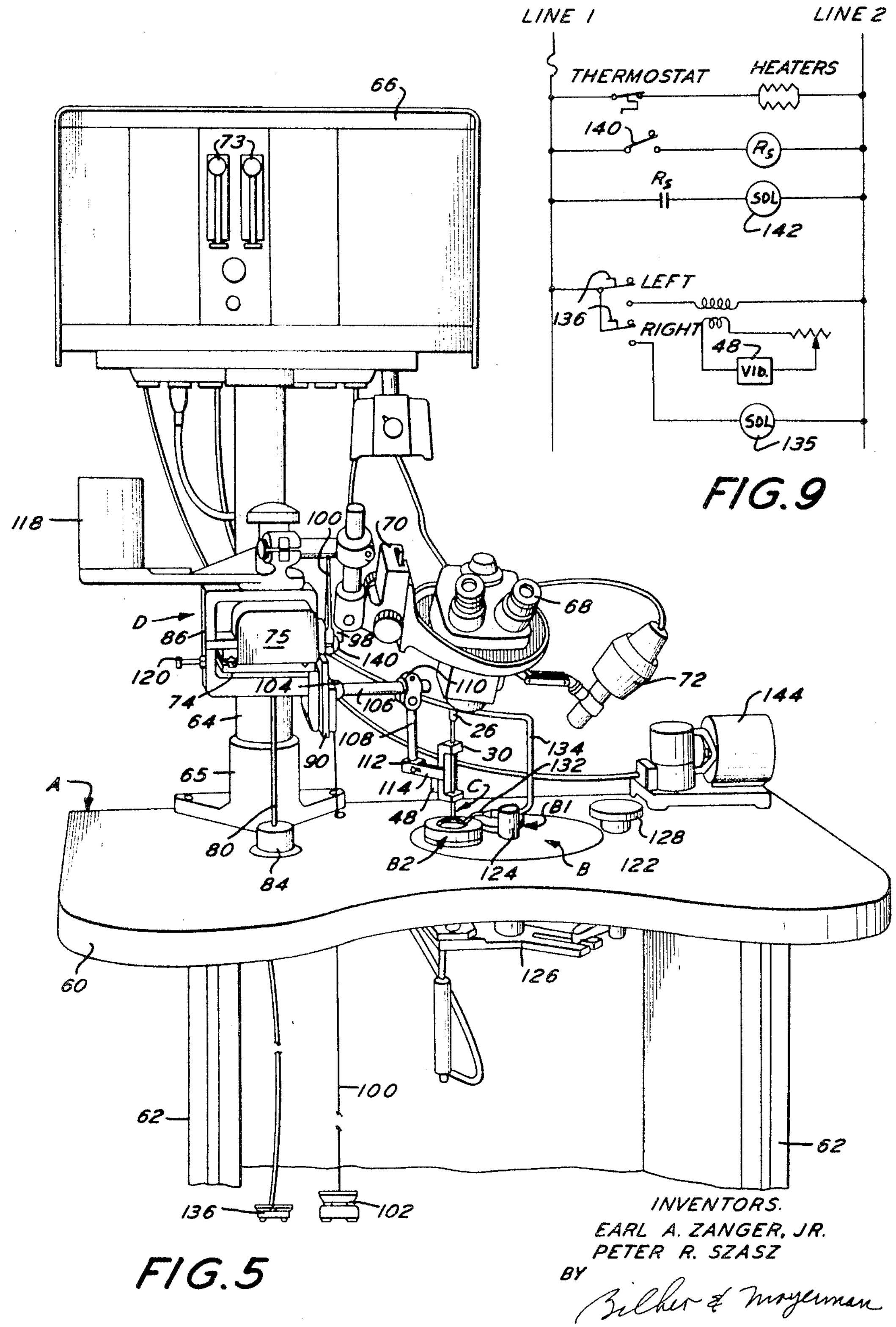
FIGURE 5 is a perspective view of a wafer bonding apparatus embodying this invention.
FIGURE 9 is an across-the-line schematic diagram of the electrical circuitry embodied in this invention.

Referring now in greater detail to the drawings in which similar reference characters refer to similar parts, and specifically to FIGURE 5, the apparatus of the instant invention includes a frame, generally designated as A, a rotary work stage B supported in said frame, a wafer pickup and bonding tool C mounted above said stage and carried by a micromanipulator assembly D for precise movement along X-, Y- and Z-axes.

Figure 6:
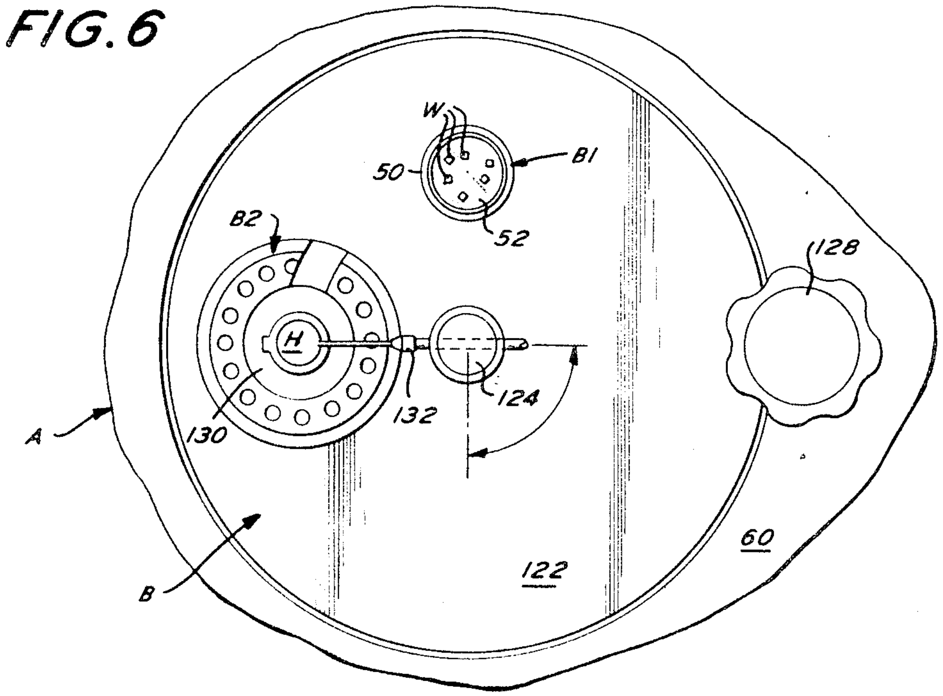
FIGURE 6 is a top plan view of a rotary table containing a pickup tray in one quadrant and a heating platen in a second quadrant.
Figure 8:
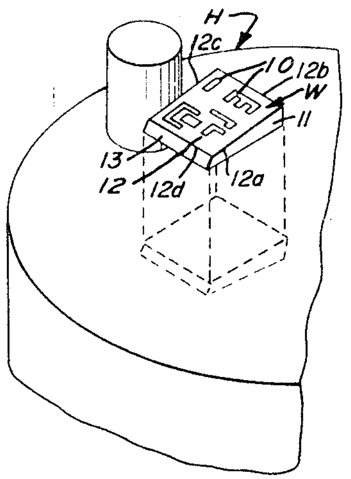
FIGURE 8 is an enlarged perspective view of a typical wafer die and the header upon which it is to be bonded.

A plurality of wafers or dice W are loaded into a tray B1 placed in one quadrant of the rotary work stage B and a header H is mounted within a heating platen B2 at a second quadrant normally 90° from the tray. See FIGURE 6. Literally hundreds of dice W may be in the tray B1 during each loading although only a few are illustrated for purposes of clarity in view of their small size. An enlarged view of a microcircuit wafer or die W is shown in FIGURE 8, it being the function of this invention to pick-up one wafer at a time from the tray and transfer it to the top of the header H for bonding.

Each wafer W is of generally square configuration and comprises a chip of germanium or silicon semiconductor material, for example, which has discrete electrodes 10, termed "geometry" alloyed or otherwise formed on the upper surface 12 thereof. These dice W have been previously sliced or scribed from a larger slab upon which the geometry was incorporated in regularly defined rows and files. From FIGURE 8, it is to be observed that the edges 11 and 13 of the wafers may be trapezoidal in configuration which results from breaking of the crystalline semiconductor slabs along the scribed lines and also because of possible nonuniformity in thickness which yields a wedge between the upper and lower surfaces.

Figures 1, 2, 3, 3A, 4:
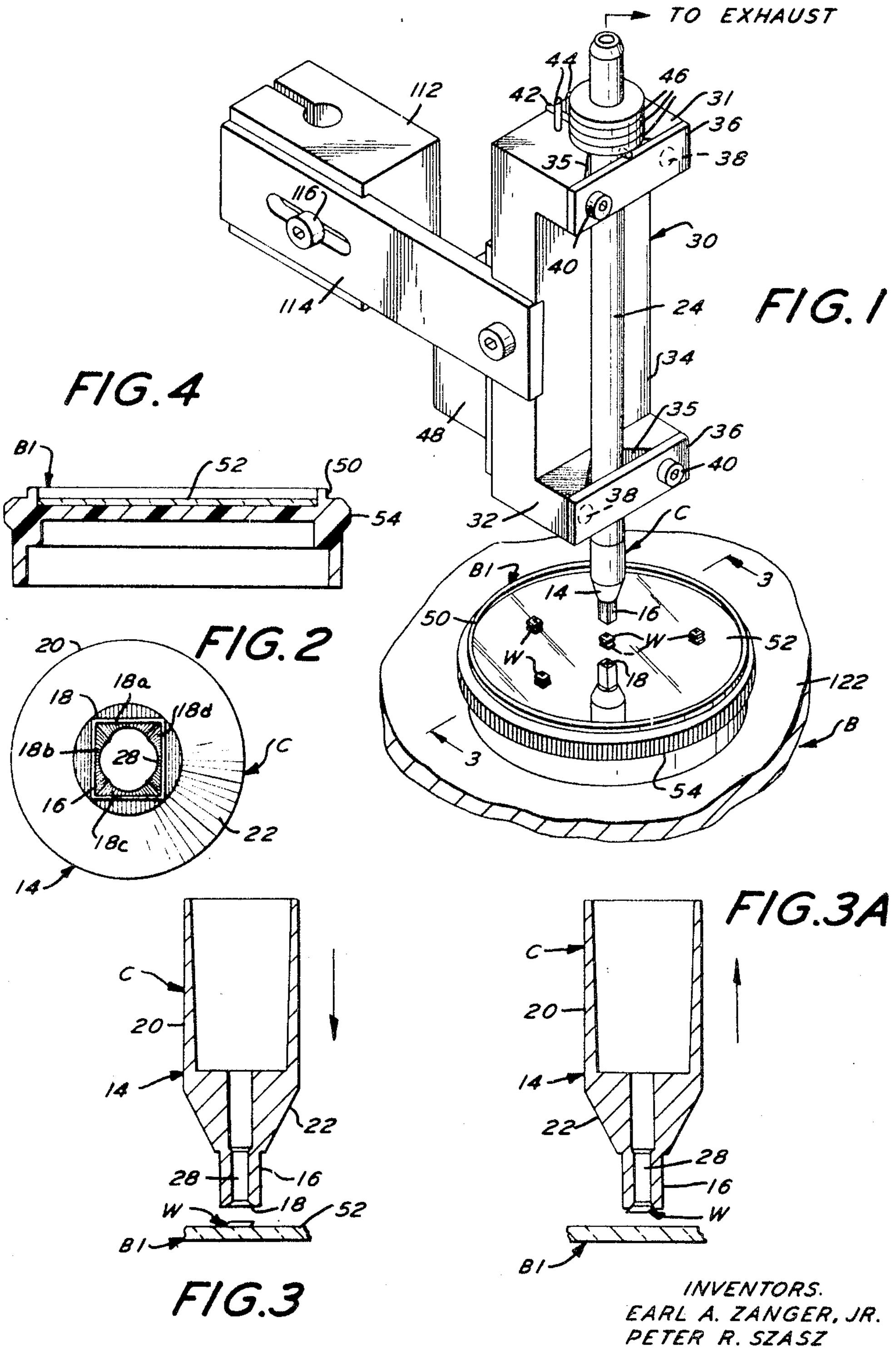
FIGURE 1 is a perspective view of a wafer pickup and bonding tool embodying this invention.
FIGURE 2 is an enlarged bottom plan view of the wafer pickup and bonding tool.
FIGURE 3 is a sectional view taken along lines 3—3 of FIGURE 1.
FIGURE 3A is a sectional view similar to FIGURE 3 with the wafer being grasped by the tool.
FIGURE 4 is a sectional view of a mirrored wafer tray embodied in this invention.

Referring to FIGURES 1, 2 and 3, the pickup and bonding tool C comprises a collet 14, preferably of stainless steel, having a lower end 16 of square plan configuration into the tip of which is coined an inverted pyramidal surface 18. The pyramidal surface includes four facets *18a*, **18*b*, 18*c* and 18*d* which are each oriented at an angle of 30° from the plane of the tip and in registration with the corresponding wall of the square lower end 16. As will be more apparent hereinafter, the squared configuration of the collet's end 16 and pyramidal surface 18 facilitates its alignment with the die W under microscope observation as the collet 14 is manipulated preparatory to pick up. Thus, each die W is grasped substantially at the four upper perimetrical portions 12*a*, 12b, 12*c* and 12*d* thereof within the respective facets of the pyramidal surface 18 without the surface electrodes 10** being touched in any way.

The collet 14 has a tubular body portion 20 which is tapered at 22 so as not to interfere with the line of sight during observation under a microscope. The body portion 20 is tapered and press fitted over the correspondingly tapered lower end of a tubular member 24 in communication with an exhaust line 26. A drilled bore 28 in the collet 14 extends from the pyramidal surface 18 through the tip 16 and tapered shank 22 to the interior of the body portion 20.

Referring to FIGURE 1, the tool C, the tubular member 24 with its depending collet 14, is slidably supported along a vertical axis in a head 30. The head 30 is a C-shaped member having a pair of vertically spaced arms 31 and 32 which extend horizontally from a medial portion 34. Each of the arms 31 and 32 has a V-groove 35 which acts as a vertical guideway for the tubular member 24. Plate straps 36 are secured to the face of each of the arms 31 and 32 by socket headscrews 40 at one side of the V-grooves. Cone pointed set screws 38 are threaded into tapped holes extending through the arms 31 and 32 and bear against the inner face of the straps 36 at the opposite side of the V-grooves. Adjustment of the set screws 38 permits variation in the bearing pressure of the plate straps 36 against the wall of tubular member 24, and the adjustment is made so that the tool C is free to slide vertically with minimal lateral play. A pin 42 transversely extends through the upper portion tubular member 24 and restricts the tool C from descending below a predetermined vertical level with respect to the head. The rearward portion of the pin 42 is slidably contained between a pair of dowels 44 upstanding from arm 31 so as to maintain the polar orientation of the collet tip 16 in a fixed position. Washers 46 may be placed around the tubular member 24 and rest on the pin 42 whereby the loading force of the pickup and bonding tool C can be varied. A vibrator element 48 which may be a standard bell buzzer, for example an Edwards Lungen #15, size "0," is mounted on the back of the head 30 and is electrically actuated during the bonding of the wafer W to the header H. This causes the tool C to oscillate whereby the wafer W grasped therein is scrubbed against the header H to speed up eutectic formation.

The tray B1 is a shallow disk-like receptacle which is slidable on the surface of the rotary table B. It includes a circular bezel portion 50 which embraces a glass-mirrored disk 52 for holding the wafers W themselves. The periphery of the bezel 50 is knurled at 54 in order to facilitate the grasping of the tray B1 by the operator's fingers and coarsely orienting one die W at a time along X-, Y- and rotary axes under the tip of the tool C. The back surface mirror on the disk 52 facilitates the registration of each die W with respect to the pyramidal surface 18 by permitting observation of the pyramidal surface 18 through its reflected image. This is especially important during the fine positioning of the tool C above the wafer because of the fact that the squared tip 16 of the collet 14 is somewhat larger than the individual dice themselves and would otherwise obscure a wafer from view when the tool C is directly thereabove.

Referring now to FIGURE 5, the frame A includes a polished table top 60 of a hard thermosetting plastic material, such as phenol formaldehyde or urea formaldehyde resin, which is supported above the floor by suitable legs 62. A post 64 is mounted upon the table top 60 by a bracket 65 and supports a console modular unit 66 containing the various electrical and gas control components. The manipulator D upon which the pick-up and bonding tool C is mounted is adjustably affixed to the post 64 by suitable brackets (not shown). A stereo-microscope 68 is hingedly supported upon a pod 70 which is clamped to the upper portion of the manipulator housing so that the operator may conveniently orient the microscope into a position focused over the work and observe the operations under three-dimensional magnification. A suitable illuminator 72 projects a beam of light upon the surface of the rotary stage B immediately below the tool C. Flow meters 73 and associated gas control valves are exposed on the face of the console 66 for convenient adjustment of pressure and rates of flow.

Figure 7:
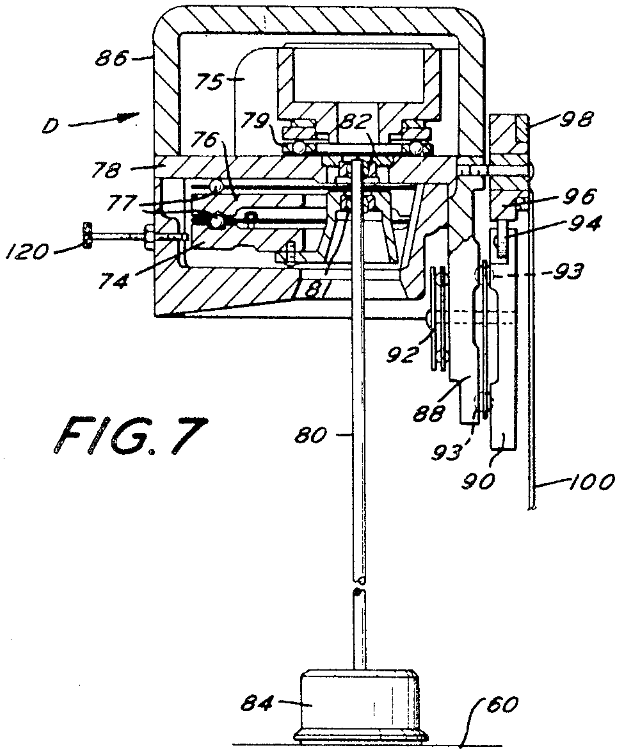
FIGURE 7 is a sectional view of a micromanipulator for horizontally positioning and vertically reciprocating the tool with respect to the wafers and then depressing the tool with the wafer grasped therein into bonding contact with a header assembly contained in the heating platen.

The manipulator D comprises a micropositioning assembly substantially identical to that fully shown and described in United States Patent No. 3,149,510, issued Sept. 22, 1964, for an invention by Frederick W. Kulicke, Jr., in "Fine Wire Manipulator and Bonding Instrument for Transistors." As is best illustrated in FIGURE 7, a fixed base stage 74 which is carried in yoke 75 affixed to column 64, carries a first stage slider 76 which is slidable on balls 77 contained within respective races and is movable into and out of the plain of the paper as shown in FIGURE 7. A second stage slider 78 also glides on balls 77 carried within respective raceways therein upon the first stage slider 76 from right to left or from left to right as shown in FIGURE 7. Thrust bearing 79 resiliently compresses the first and second stage sliders between the yoke 75 and the base stage 74. Rod 80 which is coupled to a universal bearing 81 in the yoke 75 and universal bearing 82 in the second stage slider 78 downwardly depends therefrom through the first stage slider 76 and the base 74 where it is coupled at its lower end to a finger piece 84 slidable upon the table top 60. Horizontal positioning or movement of the finger piece 84, called a "chessman," upon the surface of the table top 60 transmits a proportionally reduced movement along the corresponding horizontal X- and Y-axes through the sliders to housing 86 which is secured to the second stage slider 78. A vertical guideway plate 88 is secured to the right hand edge of the housing 86, as shown in FIGURE 7, and slidably supports Z-axis slider 90 which is coupled to the face thereof by a spring carriage 92 and glides upon balls 93 contained within respective vertical raceways. Internal springs (not shown) bias the Z-axis slider 90 upwardly so that a roller 94 at its upper edge is urged into abutment with eccentric 96 rotatably supported upon the housing 86. A crank arm 98 is connected with the eccentric 96, and a string 100 couples the outboard end of the crank 98 to a foot treadle 102 resting on the floor. Depression of the foot treadle 102 actuates the crank arm 98 through the cord 100 so as to urge the Z-axis slider downwardly against the bias of the springs. This correspondingly depresses the bonding tool C into engagement with a wafer and thereafter the wafer retained therein into contact with a header H in the heating platen B2.

Horizontally extending from the face of Z-slider plate 90 is rod 104 mounted in collar 106 secured thereto. A vertical pivot rod 108 downwardly depends from socket 110 affixed to horizontal rod 104. Split clamp block 112 is secured to the lower end of pivot rod 108, and slotted bar 114, which is secured at one end to the head 30, is slidably adjusted horizontally upon block 112 by screw 116. A counterweight 118 is mounted upon the manipulator housing 86 and offset therefrom to compensate for the off-balance load of the tool C and its supporting linkage. Thumbscrew stops 120 at the left of the housing 86 of manipulator D and at the rear of the manipulator (not shown) provide an adjustable limit for the final position of the dice upon the header H in the heating platen B2. The thumbscrew stop 120 which is shown is adjusted so that it will bear against the base stage 74 when the tool C is centered in an horizontal X-direction above the header H in platen B2 after the stage B has been rotated into the position shown in FIGURE 6, i.e. bonding position. Similarly, the thumbscrew stop not shown but at the rear of the manipulator D is adjusted so that it will bear against the base stage 74 when the tool C is centered in a horizontal Y-direction above the header H.

The work stage B comprises a turntable 122 which is rotatable with a vertical shaft 124 journaled within a Geneva drive assembly 126 supported under the table top 60. It is not deemed important with respect to the instant invention to go into detail of the Geneva drive system 126 except that the stage B may be rotated into one of two positions at 90° from each other by hand turning indexing knob 128 is coupled to suitable camming and/or gearing below the table 60 which serves to turn the Geneva drive 126 and detentively lock the turntable 122 at 90° quadrants. See FIGURE 6. It is to be noted that any manner of shifting the position of the wafers W and the headers H in the heating platen B2 with respect to the tool C may be employed, for example, the apparatus shown in Patent No. 3,083,291 entitled "Device for Mounting and Bonding Semiconductor Wafers," or in Kulicke & Soffa Catalogue Sheet and Instruction Manual, Series 601-U, dated Dec. 30, 1963, entitled "Steady State Wafer Bonders."

The heating platen B2 comprises a holder 130 for detachably receiving a wafer W grasped in the tool C. A thermostatically controlled heating element, as illustrated in FIGURE 9, is contained within the holder 130 and elevates the temperature of each successive header H to that whereupon a eutectic bond may be formed as each wafer W is depressed upon the header surface. A supply of nitrogen cooling gas in intermittently supplied to nozzle 132 through tubing 134 which is coupled by way of a solenoid-actuated valve (not shown) in the module 66 to a tank or bottle of nitrogen under pressure. As shown in FIGURE 9, the solenoid 135 of the cooling valve is actuated by depressing double-pole foot switch 136 on the floor at its right hand portion. This energizes the solenoid in a conventional manner and permits a large volume of nitrogen cooling gas to envelop the header H and freeze the bond. Depression of the foot switch 136 at its left portion energizes the vibrator 48 during the bonding operation and oscillates the tool C whereby the wafer W grasped therein and urged into contact with the header H will scrub the header's surface and speed up eutactic formation.

A microswitch 140 is mounted on the manipulator housing 86 and has normally open contacts which are closed by the depression of the Z-axis slider 90 below a predetermined level. As shown in FIGURE 9, the microswitch 140 is series connected with a stepping relay $R_s$ across the line 102. The stepping relay contacts $R_s$ are alternately closed and opened with each closure of the microswitch contacts and operate vacuum solenoid 142 which controls a valve (not shown) in the module 66 for permitting a vacuum to be supplied to the tool C through tubing 26 from exhaust pump 144. The last-mentioned valve is a conventional three-way type which vents the vacuum for the tool C to atmosphere when solenoid 142 is deenergized thereby permitting the die W held in the collet 14 to be released instantly during bonding.

As is apparent from the foregoing description, the operation of the wafer pickup and bonding tool and the method for transferring the wafer dice W and bonding them to the headers H is as follows:

A plurality of the dice W are loaded upon the mirror disk 52 of the tray B1 with the contacts 10 facing upwardly. A header H is mounted using a tweezers within the platen B2 which has been elevated to a temperature of approximately 300° C. Index knob 128 is turned until the turntable B is rotated and detented into a position with the tray B1 under the tool C. While observing the work under the microscope 68, the tray B1 is slidably oriented by hand upon the surface of turntable 122 until one wafer W is coarsely positioned below the tool C along X-, Y- and polar axes.

The foot treadle 102 is partially depressed until the tool C is immediately spaced above the wafer W in a "hovering" position, and the finger piece 84 is slidably oriented upon the table top 60 until the collet 14 is in precise registration with the wafer. The reflected image of the pyramidal surface 18 and the image of the wafer from the mirror 52 is observed under the microscope 68 to perform the alignment. The treadle 102 is now fully depressed thereby causing the facets 18 of the tool C to be urged into abutment with upper perimetrical portions of the wafer. The tool C slides within the grooves 35 of the head 30 and bears with a predetermined substantially constant force upon the wafer, and the latter self-aligns itself within the pyramidal surface. When the Z-slider plate 90 has descended to a predetermined level (a level at which the tool C has already touched the wafer), the crank lever 98 causes the microswitch 140 to close and energize stepping relay $R_S$. At this step, solenoid 142 is energized and a vacuum applied to the bore 28 of the tool C. Accordingly, the wafer W is grasped at its perimetrical portions by the pyramidal facets 18. See FIGURE 3.

Releasing foot treadle 102, elevates the tool C with the wafer W retained in the collet 16 since solenoid 142 remains energized even upon reopening of the microswitch 140. The lower surface of the wafer is retained parallel to the upper face of the turntable 122. See FIGURE 3A.

The index knob 128 is now turned until the stage B is rotated and locked in a position with the platen B2 under the tool C. See FIGURE 6. The manipulator D is moved by finger piece 84 against stops 120 or micropositioned so that the wafer W is properly oriented with respect to the subjacent header H.

Foot treadle 102 is depressed again to bring the wafer W grasped in the tool C into contact with the surface of header H. Microswitch 140 releases and energizes stepper relay $R_s$ which now opens its contacts thereby deenergizing vacuum solenoid 142 and immediately venting the vacuum to atmosphere. While still holding the treadle 102 down, the left side of footswitch 136 is depressed and causes actuation of vibrator 48. The tool C oscillates and scrubs the lower surface of the wafer in the collet 14 against the header H thereby abrading away interfacial oxides. Note that the loading force is applied about the perimetrical portions of the wafer and a uniform pressure exerted without touching the central portion thereof. Minimal heat loss is effected since only line contacts by the facets of the instant tool are made with perimetrical portions of the wafer W rather than the surface-to-surface contact made by prior art tools. When a fillet appears about the periphery of the wafer, the left side of footswitch 136 is released to stop oscillations, and the right side of said foot switch depressed to actuate solenoid 135 thereby directing flow of cooled nitrogen through nozzle 132 upon the header H with the wafer thereon to freeze the eutectic bond. Foot treadle 102 is released so that tool C is again elevated. Knob 128 is again rotated to bring the tray B1 under the tool C and the platen B2 to the front of the table 60. The wafer bonded header is removed, footswitch 136 fully released, and a fresh header H inserted.

The cycle is repeated for subsequent bonds.

Although this invention has been described in considerable detail, such description is intended as being illustrative rather than limiting since the invention may be variously embodied without departing from its spirit and the scope of the invention is to be determined as claimed.

What is claimed is:

1. A bonding tool for positioning and orienting a solid state wafer device of the type having a plurality of electrode geometries contained within the perimetrical edges of the upper surface of the wafer, said tool comprising:
- an upper body portion adapted to be connected to a holder,
- a lower end portion,
- said lower end portion terminating in a tip,
- a bore through said portions adapted to be connected to suction means for applying a suction to said tip,
- and a cavernous working face in said tip,
- said working face comprising:
  - a plurality of individual upwardly and inwardly inclined geometrical surfaces engageable with the perimetrical edges of the upper surface of said wafer without touching or engaging the the upper surface of the wafer, whereby the wafer is simultaneously rotationally positioned, aligned and oriented by engagement with the cavernous working face of the tool.

2. A bonding tool as set forth in claim 1, wherein said plurality of upwardly and inwardly inclined geometrical surfaces consist of three or more substantially flat interconnected planes.

3. A bonding tool as set forth in claim 2, wherein said geometrical surfaces form a pyramidal working surface in the tip of said tool.

4. A bonding tool as set forth in claim 1, which further includes means for slidably mounting said bonding tool, suction means for holding the positioned wafer in said bonding tool and means for vibrating said tool and said wafer during a bonding operation.

5. A bonding tool for positioning and orienting a solid state wafer device of the type having substantially flat upper and lower surfaces and a plurality of individual vertical sides at the perimetrical edges, said tool comprising:
- an upper body portion adapted to connect to a holder,
- a lower end portion terminating in a tip,
- a cavernous recessed portion in said tip having:
  - a plurality of exposed inwardly converging surfaces adapted to engage a plurality of individual perimetrical edges of the upper surface of said wafer device to position and orient the edges of the wafer device in parallel alignment therewith without contacting the upper surface of said wafer device.

6. A bonding tool as set forth in claim 5, wherein said plurality of exposed inwardly converging surfaces comprise inclined facets disposed in a pyramidal configuration.

7. A bonding tool as set forth in claim 6, which further includes a bore through said tool for applying a partial vacuum to said cavernous recessed portion to hold a positioned wafer device in said bonding tool subsequent to vibrating said tool and said wafer device during a bonding operation.

8. An apparatus for bonding semiconductor wafers to headers comprising a frame, a stage rotatably movable in said frame, a heating platen for holding one header at a time in said stage, a tray holding a plurality of wafers in said stage, a head vertically reciprocable in said frame, a pickup tool supported in said head and restrained from descending below a predetermined horizontal level therein, means for moving said stage until said tray is oriented under said tool, manipulating means for positioning said head and said tray with respect to each other in a horizontal plane until said tool is in registration above one wafer at a time, said tool including a terminal recessed portion having exposed facets inclined therein with respect to each other for engaging perimetrical portions only of the wafer and a bore communicating with said recessed portion, means for depressing said head until said inclined facets are urged into engagement with perimetrical portions of said registering wafer without touching the central portion of the surface thereof intermediate the perimetrical portions, means for applying a suction to said bore when said terminal recessed portion engages said wafer so as to grasp said wafer in said tool, means for elevating said head with said wafer grasped at its perimetrical portions in said recessed portion, means for moving said stage until said platen and said header are oriented under said tool, and means for depressing said tool and urging said perimetrically grasped wafer into bonding engagement with said header.

9. A bonding tool as set forth in claim 1, wherein said plurality of individual upwardly and inwardly inclined geometrical surfaces consist of a hard metallic nonresilient material providing a long wear cam engagement surface cooperable only with the upper perimetrical edges of the upper surface of the wafer.

10. A bonding tool as set forth in claim 9, wherein said plurality of individual upwardly and inwardly inclined geometrical surfaces are each oriented at an angle of approximately thirty degrees from the plane of the tip.

11. A bonding tool as set forth in claim 9, wherein said plurality of individual upwardly and inwardly inclined geometrical surfaces comprise a cavernous working face slightly larger than the upper surface of a solid state wafer device being positioned and oriented, and wherein the end of the tip of the tool terminates intermediate the upper and lower surface of the wafer to enable camming action during positioning and orientation, and to provide positive horizontal restraint between said bonding tool working face and said wafer during bonding.

References Cited

UNITED STATES PATENTS

| | | | |
|---|---|---|---|
| 3,357,090 | 12/1967 | Tittany | 228—3 X |
| 3,083,291 | 3/1963 | Soffa et al. | 219—85 |
| 1,037,851 | 9/1912 | Beam | 51—235 |
| 2,915,201 | 12/1959 | Calehuff et al. | 214—1 |

RICHARD H. EANES, Jr., Primary Examiner